United States Patent Office 3,328,275

Patented June 27, 1967

3,328,275
TREATMENT OF COPPER TO FORM A DENDRITIC SURFACE

Warren V. Waterbury, Utica, N.Y., assignor to Revere Copper and Brass Incorporated, Rome, N.Y., a corporation of Maryland No Drawing. Filed Dec. 18, 1963, Ser. No. 331,382
2 Claims. (Cl. 204—38)

This invention relates to the surface treatment of sheet copper and, more particularly, to the treatment of such a surface preparatory to the production of printed electric circuits.

One of the presently favored methods of producing printed circuits comprises the acid etching of a metal foil-clad laminate. The laminate, consisting of a filler and a plastic binder, provides an insulating base material which can be clad with metal foil. The foil is generally bonded to the laminate base material, either with or without an intervening layer of plastic adhesive, and considerable effort has been directed to the development of adhesives which will provide adequate bonding strength between the laminate and the foil. Copper is generally used as the foil material, and electrodeposited copper foil has been found heretofore to be more amenable to strong bonding to the laminate base material than rolled sheet copper foil. However, rolled copper sheet has electrical, physical and chemical characteristics that make it highly desirable as the foil component of printed circuits if satisfactory strength of the bond between the foil and the laminate base can be achieved.

I have now discovered a method of imparting to a surface of rolled sheet copper, as well as to electrodeposited copper, the ability to be tenaciously bonded to a plastic material, whether the plastic material is the adhesive for a printed circuit assembly or is a painted, protective or decorative coating for the copper, or any other similar plastic layer. The method of the invention comprises cleaning the surface of the copper sheet to be treated, making the cleaned copper sheet surface a cathode in an electrolytic copper deposition cell, passing electric current to the cleaned copper sheet surface with a cathode current density sufficient to produce a dendritic deposit of copper thereon, maintaining quiescence in the bath so as to promote cathodic polarization at the deposition surface by impoverishment of copper ions immediately adjacent the surface of the sheet, and continuing the electrodeposition of copper on the dendritic deposit until the outer ends of the dendrites become enlarged. The resulting surface, when coated with a hardenable plastic material, so locks itself to the hardened plastic as to form an extremely tenacious bond between the copper sheet and the plastic.

The preliminary cleaning step in my method is a conventional operation common to any copper plating or electrodeposition process. The purpose of this step is merely to provide a greaseless oxide-free surface on the copper sheet, and any of the conventional copper cleaning baths may be used satisfactorily. For example, grease and oil may be effectively removed by passing the rolled copper sheet through a bath of an alkaline cleaner such as an alkali metal hydroxide, carbonate, phosphate, or the like, or through an organic solvent such as trichlorethylene, or by electrolytic degreasing in an alkaline bath. Of course, if the copper sheet to be treated pursuant to the invention is obtained in a form sufficiently clean to be fed directly to the electrodeposition step, then the preliminary washing step is unnecessary and is eliminated.

I have also found it advantageous, although not essential, to surface etch the clean rolled copper sheet before carrying out the ultimate electrodeposition pursuant to the invention because etching enhances the final bond strength. For this purpose I have found that an ammonium persulfate solution, generally containing from about 5 to about 25 grams per liter of $(NH_4)_2S_2O_8$, is a particularly satisfactory etchant for use in a continuous process. However, other etchants such as dilute sulfuric acid, dilute hydrochloric acid, dilute nitric acid, and ferric chloride, chromic acid, phosphoric acid, alkali metal cyanide and acidified sodium bichromate solutions can be used effectively. An etched surface can also be produced by electrolytically etching the copper surface.

The ultimate copper electrodeposition pursuant to my invention is effected by making the clean copper sheet surface a cathode in an electrolytic copper deposition cell, that is, the sheet is positioned in the cell with a clean sheet surface facing the cell anode. Conventional copper electrodeposition bath compositions are used. Thus, the deposited copper may be derived from the bath or from a consumable copper anode. For example, a copper anode is used with a conventional bath containing copper sulfate within the range of 15 to 200 grams (preferably 140) per liter of $CuSO_4 \cdot 5H_2O$ and free sulfuric acid within the range of 15 to 125 (preferably 65) milliliters of $H_2SO_4$ per liter of bath, but with such a bath it is unnecessary and generally undesirable to include the usual addition agents (such as animal glue or the like) which are generally added to prevent the growth of dendrites. Conventional copper plating baths are also effective and include the high-strike cuprous and cupric cyanide baths as well as the usual copper cyanide-rochelle salt and copper fluoborate baths. Thus, all copper electrodeposition bath compositions are effective in the practice of the method of the present invention. The bath temperatures are also advantageously those conventionally used such, for example, as temperatures within the range of 70° to 140° F., the optimum temperature being within the range of 90° to 110° F.

The electrodeposition of copper on the copper sheet surface is carried out, pursuant to the invention, at current densities higher than those conventionally used. That is, the cathode current density is sufficiently high, with regard to the cell geometry, bath composition and temperature, to produce a dendritic or rough copper deposit rather than the conventionally desired smooth deposit. The magnitude of the cathode current density which will produce this result cannot be categorically slated because it is influenced by many operating values as well known to those skilled in the electrolytic copper deposition art. Representative illustrations of the magnitude of these current densities are set forth in the specific examples herein, and from these examples one skilled in the art can readily determine an appropriately effective cathode current density to use with any combination of bath conditions and cell geometry.

The mere deposition of a dendritic copper structure is not sufficient to obtain the surface characteristic of the treated copper sheet surface pursuant to the present invention. Electrodeposited dendrites normally have an acicular form with the ends generally tapered so that the ends are more slender than the bases. The dendrites obtained by the practice of the present invention are characterized by enlarged ends which, when embedded in an adjacent coating or layer, provide a locking action which accounts at least in part for the tenacious bond between the copper sheet and the adjacent coating or layer. In order to obtain this enlarged terminal characteristic of the dendritic deposit, I have found it necessary to promote cathodic polarization adjacent the bases of the dentrites. This polarization is obtained by at least partial depletion or impoverishment of copper ions in the bath progressively inwardly toward the surface of the sheet on which the deposit is being made, and I have found that at the relatively high current densities used to obtain such dendritic deposit the further maintenance of quiescence in the bath will promote an effective degree of cathodic polarization near or at the surface of the sheet. Such quiescence can be attained effectively in a continuous operation by proper attention to the procedure for withdrawal of a portion of the bath for filtering and cooling and to careful distribution into the cell of the thus cleaned and cooled bath portion. The combination of these conditions of high current density and controlled polarizatiton results in the preferential deposition of copper at the ends of the dendrites rather than at their bases and, when maintained for a sufficient period of time at the desired rate of current flow, lead to the formation of dendrites characterized by terminal portions which are of enlarged thickness compared with the bases of the dendrites.

The method of the invention is particularly amenable to continuous operation so that an entire roll of rolled copper sheet can be treated without interruption or discontinuity in its bonding surface characteristics. Thus, as the roll is unwound, the sheet is advantageously passed serially through a cleaning bath, an etching bath, a wiper or a rinsing bath, an electrodeposition bath and a final drying zone. The length of the path of travel of the sheet through each bath is chosen so that, at any desired speed of travel of the sheet, it will be acted upon for the proper period of time in each treating state.

The following specific examples are illustrative but not limitative of the practice of the invention. In each example, rolled copper sheet in strip form, and weighing one ounce per square foot, was passed first through a conventional alkaline cleaning bath, then through a 20% by weight ammonium persulfate bath and a spray rinse, thence through an electrodeposition bath, double water rinsing sprays and then to a final drying zone. The following data provides the electrolyzing conditions in the electrodeposition bath which, in each example, provided conditions that resulted in the formation on the anode side of the sheet of a deposit of minute copper dendrites characterized by enlarged or bulbous terminal portions:

*Example I*

| | | |
|---|---|---|
| $CuSO_4 \cdot 5H_2O$ | g./l. | 133 |
| $H_2SO_4$ | percent | 9.98 |
| Temperature | ° F. | 100 |
| Anodes | | [1] |
| Current | amps | 2200 |
| Voltage | volts | 7 |
| Strip speed | ft./min. | 10 |
| Amp. minutes per $in.^2$ | | 0.510 |

[1] Copper anodes 5'' from strip.

*Example II*

| | | |
|---|---|---|
| $CuSO_4 \cdot 5H_2O$ | g./l. | 133 |
| $H_2SO_4$ | percent | 9.98 |
| Temperature | ° F. | 74 |
| Anodes | | [1] |
| Current | amps | 1400 |
| Voltage | volts | 6 |
| Strip speed | ft./min. | 11 |
| Amp. minutes per $in.^2$ | | 0.296 |

[1] Copper anodes 5'' from strip.

*Example III*

| | | |
|---|---|---|
| $CuSO_4 \cdot 5H_2O$ | g./l. | 133 |
| $H_2SO_4$ | percent | 9.98 |
| Temperature | ° F. | 95 |
| Anodes | | [1] |
| Current | amps | 3000 |
| Voltage | volts | 9 |
| Strip speed | ft./min. | 18 |
| Amp. minutes per $in.^2$ | | 0.356 |

[1] Copper anodes 5'' from strip.

The final strip product of each example was then bonded to a representative base material for printed electronic circuits. This material consisted of glass cloth impregnated with an epoxy resin. Bonding between this and the copper sheet was carried out according to the manufacturers' recommendation by the use of a temperature of 325–350° F. and a pressure of 900–1000 p.s.i. After bonding and cooling, a one inch square sample was cut out, the edge of the resinous bonding material was pried up and pulled free until the parting line extended across the square and parallel to one edge of the square. The bonding material was then pulled away in a direction perpendicular to the sheet. The tension on the coating required to pull the remaining adhering portion away from the strip was measured and ranged between 10 and 11 pounds per inch of width for each of the products of Examples I, II and III. These values exceeded that of 8 pounds per inch of width which has been set as the desirable value by manufacturers of printed circuits.

I claim:

1. The method of imparting to a surface of sheet copper the ability to be tenaciously bonded to a plastic material which comprises (a) making a clean copper sheet surface a cathode in an electrolytic copper deposition cell, (b) passing electric current to the clean copper sheet surface with a cathode current density sufficient to produce a dendritic deposit of copper thereon, (c) establishing and maintaining sufficient impoverishment of copper ions immediately adjacent the deposition surface as to promote cathodic polarization at said surface with resulting preferential deposition of copper at the outer end of the dendrites, and (d) continuing the electrodeposition of copper on the dendritic deposit until the outer ends of the dendrites become enlarged.

2. The method according to claim 1 in which the copper sheet is cleaned and etched prior to being made the cathode in said cell.

References Cited

UNITED STATES PATENTS

| | | | |
|---|---|---|---|
| 2,802,897 | 8/1957 | Hurd et al. | 174—110 |
| 2,984,595 | 5/1961 | Schumpelt et al. | 156—151 |
| 3,220,897 | 11/1965 | Conley et al. | 148—34 |
| 3,227,636 | 1/1966 | De Hart | 204—38 |
| 3,227,637 | 1/1966 | De Hart | 204—38 |

FOREIGN PATENTS 757,892 9/1951 Great Britain.

JOHN H. MACK, *Primary Examiner.*

W. VAN SISE, *Assistant Examiner.*